US012772777B2

(12) United States Patent
Akiyoshi et al.

(10) Patent No.: US 12,772,777 B2
(45) Date of Patent: Oct. 20, 2026

(54) METHOD FOR MANUFACTURING SEMICONDUCTOR APPARATUS AND SEMICONDUCTOR MANUFACTURING APPARATUS COMPRISING AMORPHOUS LAYER BETWEEN WAFER AND RING-SHAPED FRAME

(71) Applicant: Mitsubishi Electric Corporation, Tokyo (JP)

(72) Inventors: Kyohei Akiyoshi, Tokyo (JP); Yosuke Nakanishi, Tokyo (JP); Masaru Yamada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 362 days.

(21) Appl. No.: 18/405,429

(22) Filed: Jan. 5, 2024

(65) Prior Publication Data

US 2024/0312805 A1 Sep. 19, 2024

(30) Foreign Application Priority Data

Mar. 14, 2023 (JP) ................................ 2023-039867

(51) Int. Cl.
*H10P 72/00* (2026.01)
*H10P 72/70* (2026.01)

(52) U.S. Cl.
CPC .......... *H10P 72/0428* (2026.01); *H10P 72/74* (2026.01); *H10P 72/7416* (2026.01)

(58) Field of Classification Search
None
See application file for complete search history.

(56) References Cited

U.S. PATENT DOCUMENTS

2005/0221584 A1 10/2005 Arai
2005/0250295 A1 11/2005 Mita
(Continued)

FOREIGN PATENT DOCUMENTS

JP 2005-294623 A 10/2005
JP WO2004/001819 A1 10/2005
JP 2009-253143 A 10/2009

OTHER PUBLICATIONS

An Office Action issued by the German Patent and Trademark Office on Jul. 9, 2025, which corresponds to German Patent Application No. 102024100887.3 and is related to U.S. Appl. No. 18/405,429; with English language translation.
(Continued)

*Primary Examiner* — Daniel Whalen
(74) *Attorney, Agent, or Firm* — Studebaker Brackett PLLC

(57) ABSTRACT

According to the present disclosure, A method for manufacturing a semiconductor apparatus bonds a ring-shaped frame to an outer peripheral portion of a wafer, and comprises the steps of installing one of the wafer and the frame on a stage, holding another of the wafer and the frame in a chuck part in a pressure-bonding mechanism, activating a surface layer of the outer peripheral portion of the wafer and a surface layer of the frame by atom irradiation, and sandwiching the wafer and the frame between the stage and the chuck part and pressure-bonding the activated surface layers of the wafer and the frame using the pressure-bonding mechanism. An amorphous layer is formed on a bonding interface between the wafer and the frame pressure-bonded to each other.

11 Claims, 8 Drawing Sheets

100

200

(56) References Cited

U.S. PATENT DOCUMENTS

| | | | | |
|---|---|---|---|---|
| 2011/0316003 | A1 | 12/2011 | Murphy et al. | |
| 2012/0068311 | A1* | 3/2012 | Yamazaki | H10D 12/441 438/770 |
| 2016/0189982 | A1* | 6/2016 | Iguchi | H10D 12/031 438/118 |
| 2023/0046388 | A1* | 2/2023 | Saito | C23C 16/45519 |

OTHER PUBLICATIONS

"Notice of Reasons for Refusal" Office Action issued in JP 2023-039867; mailed by the Japanese Patent Office on Dec. 16, 2025.

* cited by examiner

METHOD FOR MANUFACTURING SEMICONDUCTOR APPARATUS AND SEMICONDUCTOR MANUFACTURING APPARATUS COMPRISING AMORPHOUS LAYER BETWEEN WAFER AND RING-SHAPED FRAME

BACKGROUND OF THE INVENTION

Field

The present disclosure relates to a method for manufacturing a semiconductor apparatus, a semiconductor manufacturing apparatus and a semiconductor apparatus.

Background

There has been known a method for thickening an outer periphery of a wafer to keep its strength, preventing the wafer from warping, and preventing the wafer from being cracked and chipped in its end portion during processing. For example, there has been disclosed a technique for thinning a back surface of a device region of the wafer by grinding to relatively thicken the outer periphery.

However, in the case of a wafer formed of a hard material such as SiC, it is technically difficult to grind only a back surface of a device region of the wafer. That is, there has been a problem that the above-described method cannot be applied to the wafer that is difficult to grind.

To solve the above-described problem, JP 2004-001819 A discloses a technique for fastening a reinforcement ring made of silicon to a semiconductor substrate using an adhesive member. This makes it possible to keep the strength of the semiconductor substrate, prevent the semiconductor substrate from warping, and prevent the semiconductor substrate from being cracked and chipped in its end portion during processing.

However, the adhesive member used in the above-described method may not be resistant to a high temperature environment. Accordingly, there has been a new problem that the above-described method cannot be applied to a high temperature treatment process to which a wafer is resistant if used alone.

SUMMARY

In view of the above-described problems, an object of the present disclosure is to provide a method for manufacturing a semiconductor apparatus, a semiconductor manufacturing apparatus, and a semiconductor apparatus that are applicable to a high temperature treatment process and can prevent a wafer from warping and from being cracked and chipped.

The features and advantages of the present disclosure may be summarized as follows.

A method for manufacturing a semiconductor apparatus according to the present disclosure bonds a ring-shaped frame to an outer peripheral portion of a wafer, and comprises the steps of: installing one of the wafer and the frame on a stage; holding another of the wafer and the frame in a chuck part in a pressure-bonding mechanism; activating a surface layer of the outer peripheral portion of the wafer and a surface layer of the frame by atom irradiation; and sandwiching the wafer and the frame between the stage and the chuck part and pressure-bonding the activated surface layers of the wafer and the frame using the pressure-bonding mechanism, wherein an amorphous layer is formed on a bonding interface between the wafer and the frame pressure-bonded to each other.

Other and further objects, features and advantages of the disclosure will appear more fully from the following description.

DESCRIPTION OF EMBODIMENTS

First Embodiment

Figure 1:
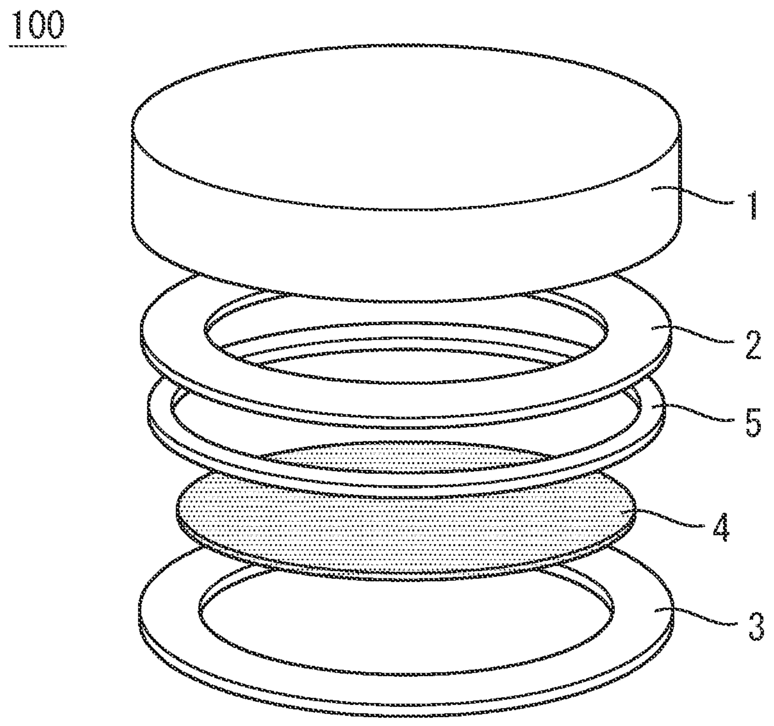
FIG. 1 is a perspective view illustrating a semiconductor manufactured apparatus according to a first embodiment of the preset disclosure.

FIG. 1 is a perspective view illustrating a semiconductor manufactured apparatus according to a first embodiment of the preset disclosure, A semiconductor manufacturing apparatus 100 is an apparatus that manufactures a semiconductor apparatus according to a first embodiment of the preset disclosure by bonding a ring-shaped frame 5 to a wafer 4.

The semiconductor manufacturing apparatus 100 includes a stage 3. The stage 3 has a first cavity. The first cavity is a columnar region, and is positioned in a central portion of the stage 3. The first cavity may be a region that penetrates the stage 3 or may be a concave region. Further, the diameter of a circle as an upper surface of the first cavity is smaller than the inner diameter of the frame 5.

During the bonding, the wafer 4 is installed on the stage 3. A plurality of semiconductor devices are formed in the wafer 4. An example of the semiconductor device is a MOSFET or an IGBT. The wafer diameter of the wafer 4 is 6 inches or more, for example. The larger the wafer diameter is, the more greatly the wafer warps. Accordingly, an aspect of the present disclosure is particularly useful.

The semiconductor manufacturing apparatus 100 includes a pressure-bonding mechanism. The pressure-bonding mechanism includes a pressure-bonding device 1 and a chuck part 2. The chuck part 2 has a second cavity. The second cavity is a columnar region, and is positioned in a central portion of the chuck part 2. The second cavity may be a region that penetrates the chuck part 2, or may be a concave region. Further, the diameter of a circle as a lower surface of the second cavity may be equal to or more than the diameter of a circle as a lower surface of the first cavity.

The chuck part 2 holds the frame 5 during the bonding. The frame 5 has a ring-shaped form. An example of the frame 5 may be a ring-shaped member directed toward the center of the wafer 4 when viewed from the top and having a width of 1 to 5 mm from its outer periphery The diameter of the circle as the lower surface of the second cavity is smaller than the inner diameter of the frame 5. Accordingly, the frame 5 can be held on the chuck part 2.

Although an example in which the wafer 4 is a silicon carbide wafer will be described here, a material for the wafer 4 is not limited to this. An example of the material for the wafer 4 may be silicon, or may be a wide-bandgap semiconductor such as a gallium nitride-based material, a gallium oxide-based material, or diamond.

The wafer 4 and the frame 5 may be made of the same material, or may be made of different materials. An example of a case where the wafer 4 and the frame 5 are made of the same material can be a case where both the wafer 4 and the frame 5 are made of silicon carbide. If the wafer 4 and the frame 5 are made of the same material, the respective thermal expansion coefficients of the wafer 4 and the frame 5 match each other, thereby making it possible to reduce warping and cracking, during heat treatment.

An example of a case where the wafer 4 and the frame 5 are made of different materials can be a case where the wafer 4 is made of silicon carbide and the frame 5 is made of an inexpensive material such as Si or $SiO2$. The inexpensive material is used for the frame 5, thereby making it possible to reduce manufacturing costs. Further, if the cost of the frame 5 itself is lower than costs required for a reproduction process of the frame 5, described below, the frame 5 can be disposable. This makes it possible to reduce the number of man-hours and the costs required for the reproduction process.

A method for manufacturing a semiconductor apparatus according to the first embodiment of the present disclosure will be described. First, a bonding process will be described. The semiconductor manufacturing apparatus 100 is mounted in a sealed vacuum chamber. That is, the wafer 4 and the frame 5 are bonded to each other under a vacuum atmosphere.

First, the wafer 4 is installed on the stage 3, and the frame 5 is held in the chuck part 2. Then, respective bonding surfaces of the wafer 4 and the frame 5 are activated by atom irradiation. That is, a natural oxide film and impurities existing on each of an outer peripheral portion on an tipper surface of the wafer 4 opposing the frame 5 and a lower surface of the frame 5 opposing the wafer 4 are removed.

The respective activated surfaces of the wafer 4 and the frame 5 are brought into contact with each other, and the wafer 4 and the frame 5 are sandwiched between the stage 3 and the chuck part 2 and are pressure-bonded to each other by the pressure-bonding mechanism.

The semiconductor manufacturing apparatus 100 uses the stage 3 having the first cavity and the chuck part 2 having the second cavity during the bonding. The respective outer diameters of the stage 3 and the chuck part 2 are larger than the respective outer diameters of the wafer 4 and the frame 5. The respective diameters of the first cavity and the second cavity are smaller than the inner diameter of the frame 5. As a result, when the wafer 4 and the frame 5 are bonded to each other, a stress at a location other than a bonding location is reduced, thereby preventing the wafer from being cracked during the bonding.

Although an aspect in which the wafer 4 is installed on the stage 3 and the frame 5 is held in the chuck part 2 is illustrated in the above-described method, respective positions of the wafer 4 and the frame 5 may be opposite to each other. That is, the frame 5 may be installed on the stage 3, and the wafer 4 may be held in the chick part 2. As described above, the diameter of the circle as the upper surface of the first cavity is smaller than the inner diameter of the frame 5. Accordingly, the frame 5 can also be held on the stage 3.

Then, a separation process in the semiconductor apparatus according to the first embodiment of the present disclosure will be described. The separation process is a process to be performed after any semiconductor apparatus manufacturing process such as conveyance is performed after frame bonding.

Figure 2:
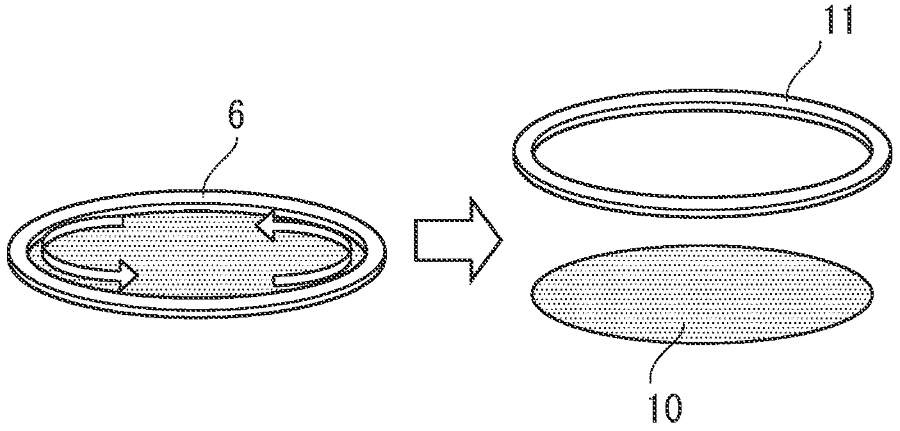
FIG. 2 is a perspective view illustrating the separation process in the semiconductor apparatus according to the first embodiment of the present disclosure.

FIG. 2 is a perspective view illustrating the separation process in the semiconductor apparatus according to the first embodiment of the present disclosure, A plurality of devices are formed on the wafer 4, and the wafer 4 is then separated into individual devices by being diced in a dicing process. The separation process is a process for separating the frame 5 from the wafer 4 before the dicing process. Specifically, the wafer 4 is cut along an end surface inside of the frame 5 bonded to the wafer 4.

The left of FIG. 2 is a diagram illustrating a frame bonded wafer before the separation. A frame bonded wafer 6 is a wafer with the wafer 4 and the frame 5 bonded to each other. For the frame bonded wafer 6, the wafer 4 is cut along an inner periphery of the frame 5.

The right of FIG. 2 is a diagram illustrating the frame bonded wafer after the separation, i.e. a diagram after the wafer 4 is cut along the inner periphery of the frame 5. As a result, the frame bonded wafer 6 is separated into a wafer 10 and a frame 11.

The wafer 10 after the cutting has a diameter that is smaller than that of the wafer 4 before the frame bonding by a length equal to or more than the width of the frame 5. The frame 11 after the cutting is thicker than the frame 5 before the frame bonding by the thickness of the wafer 4.

The frame and the wafer are thus separated from each other before the dicing, whereby the frame 5 can be reused, thereby making it possible to reduce costs.

Figure 3:
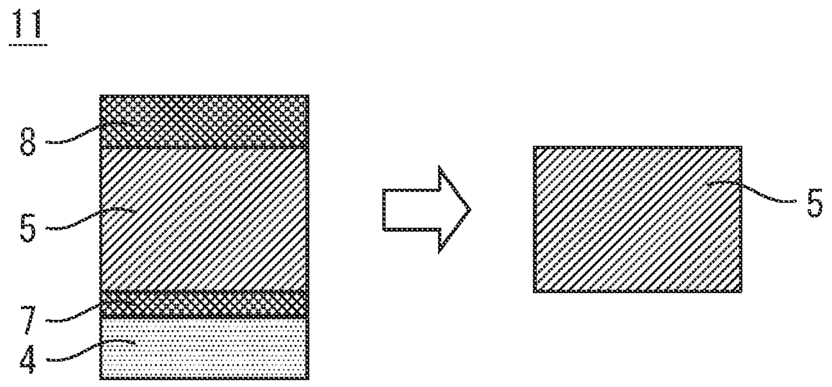
FIG. 3 is a cross-sectional view illustrating a reproduction process for the frame according to the first embodiment of the present disclosure. 2.0

Then, a process for reproducing the frame 11 after the separation to have the same specification as that of the frame 5 before the frame bonding will be described. FIG. 3 is a cross-sectional view illustrating a reproduction process for the frame according to the first embodiment of the present disclosure. The reproduction process is a process for reproducing the frame hi to bring the frame 11 into a reusable state as the frame 5.

The left of FIG. 3 is a diagram illustrating the frame 11 before the reproduction. The frame 11 before the reproduction is in a state where a part of the wafer 4 is bonded to the frame 5 in the above-described separation process. An amorphous layer 7 is formed, as described below, on a bonding interface between the frame 5 and the wafer 4. A metal film 8 formed during device manufacture adheres to a surface layer of the frame 11 before the reproduction.

Etching is first performed, to remove the metal film 8 from the frame 11. Then, grinding is performed, to remove a part of the wafer 4 bonded to the frame 5 and the amorphous layer 7.

The right of FIG. 3 is a diagram illustrating the frame 5 after the reproduction. In the above-described reproduction process, the unnecessary metal film 8 does not adhere to the frame 11, and the frame 11 is reproduced to the frame 5 having the same thickness as that before the frame bonding. Thus, the frame can be made easy to handle when reused by being reproduced to have the same specification as that of the original frame.

Figure 4:
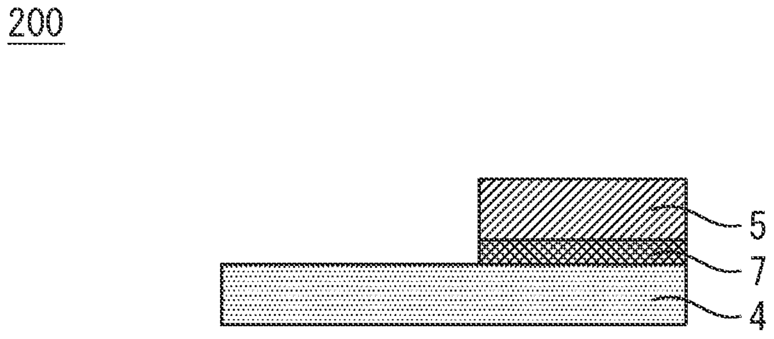
FIG. 4 is a cross-sectional view illustrating bonding in the semiconductor apparatus according to the first embodiment of the preset disclosure.

FIG. 4 is a cross-sectional view illustrating bonding in the semiconductor apparatus according to the first embodiment of the preset disclosure. In a semiconductor apparatus 200, the frame 5 is bonded to the outer peripheral portion of the wafer 4 using the above-described manufacturing method.

The amorphous layer 7 is formed on the bonding interface between the wafer 4 and the frame 5. Details of the amorphous layer 7 will be described below.

The thickness of the frame 5 is preferably equal to or more than the thickness of the wafer 4. For example, the thickness of the wafer 4 may be 100 μm to 350 μm, and the thickness of the frame 5 may be 100 μm to 500 μm. When the thickness of the frame 5 is equal to or more than the thickness of the wafer 4, the wafer 4 can be prevented from warping in a structure after the bonding.

The width of the frame 5 is preferably 1 to 5 mm. When the width of the frame 5 is smaller than 1 mm, there may occur a problem that the frame 5 alone before the bonding is difficult to handle and the strength thereof is insufficient. If the width of the frame 5 is larger than 5 mm, the frame 5 may overlap a semiconductor device region formed on a front surface of the wafer 4 when bonded to the wafer 4. Accordingly, there may occur a problem that when the frame 5 is cut from the wafer 4, the semiconductor device region is also simultaneously cut.

Further, the frame 5 preferably has the same outer diameter as that of the wafer 4, and is provided such that its end surface on the outer side is continuous with an end surface on the outer side of the wafer 4. As a result, an end portion of the wafer 4 is thickened upon being integrated with the frame 5. Accordingly, the wafer 4 can be prevented from being cracked and chipped in the end portion.

The frame 5 may be bonded to a surface, on which a semiconductor device is formed, of the wafer 4, or may be bonded to a surface, on which a semiconductor device is not mounted, of the wafer 4. The manufacture of the semiconductor device can be started with a surface, to which the frame 5 is not bonded, of the wafer 4 not processed.

Figure 5:
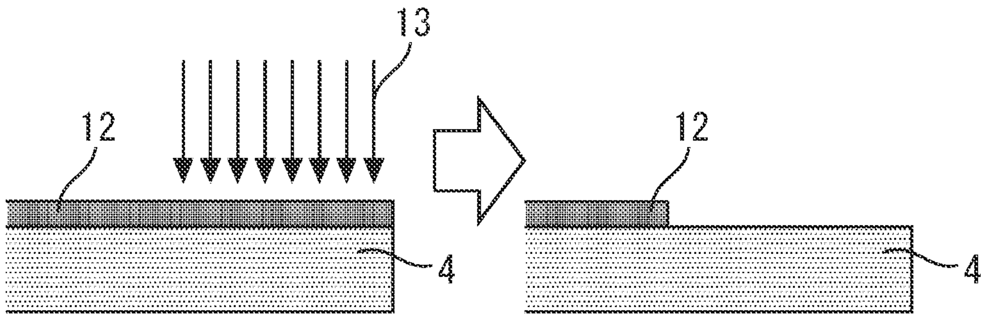
FIG. 5 is an enlarged cross-sectional view illustrating irradiation of a wafer with atoms according to the first embodiment of the present disclosure.

The amorphous layer 7 formed on the bonding interface between the wafer 4 and the frame 5 will be described in more detail. FIG. 5 is an enlarged cross-sectional view illustrating irradiation of a wafer with atoms according to the first embodiment of the present disclosure.

The left of FIG. 5 is a diagram illustrating irradiation of the wafer 4 with atoms. A natural oxide film 12 and impurities (not illustrated) exist on the front surface of the wafer 4. The natural oxide film 12 and the impurities exist, resulting in a deterioration in reactivity of a surface layer of the wafer 4. To enhance the reactivity of the surface layer of the wafer 4, a location, to which the frame 5 is bonded, of the wafer 4 is subjected to atom irradiation 13.

The right of FIG. 5 is a diagram illustrating the wafer 4 after the atom irradiation 13 is performed. In the location subjected to the atom irradiation 13, the natural oxide film 12 and the impurities are removed. In this case, an atom arrangement is disturbed. In this state, when the frame 5 and the wafer 4 are directly bonded to each other, the amorphous layer 7 is formed on the bonding interface therebetween.

Figure 6:
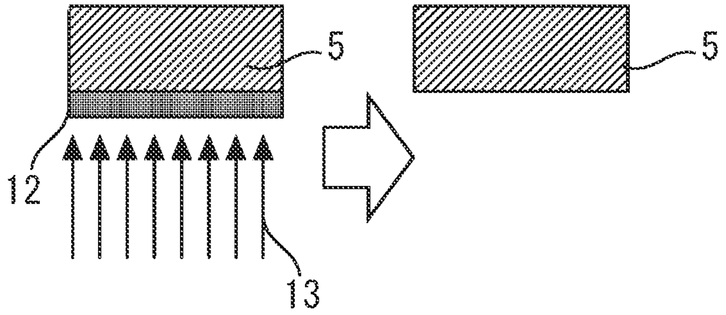
FIG. 6 is an enlarged cross-sectional view illustrating irradiation of a frame with atoms according to the first embodiment of the present disclosure.

FIG. 6 is an enlarged cross-sectional view illustrating irradiation of a frame with atoms according to the first embodiment of the present disclosure. The left of FIG. 6 is a diagram illustrating irradiation of the frame 5 with atoms. A natural oxide film 12 and impurities (not illustrated) exist on a front surface of the frame 5. The natural oxide film 12 and the impurities exist, resulting in a deterioration in reactivity of a surface layer of the frame 5. To enhance the reactivity of the surface layer of the frame 5, a location, to which the wafer 4 is bonded, of the frame 5 is subjected to atom irradiation 13.

The right of FIG. 6 is a diagram illustrating the frame 5 after the atom irradiation 13 is performed. In the location subjected to the atom irradiation 13, the natural oxide film and the impurities are removed. In this case, an atom arrangement is disturbed. In this state, when the frame 5 is directly bonded to the wafer 4, the amorphous layer 7 is formed on the bonding interface therebetween.

When the atom irradiation is performed for one or both of the surface layers of the wafer 4 and the frame 5, as described above, the amorphous layer 7 is formed on the bonding interface therebetween. As a result, the semiconductor apparatus 200 can directly bond atoms to one another without an intermediate material such as an adhesive being interposed therein. That is, the wafer 4 and the frame 5 are more firmly bonded to each other, whereby the strength on the outer periphery of the wafer 4 can be maintained. Accordingly, the warping of the wafer can be reduced. Further, the wafer 4 and the frame 5 can be prevented from separating from each other during processes for manufacturing the semiconductor apparatus 200.

The semiconductor apparatus 200 is also applicable to a high temperature treatment process because an intermediate material such as an adhesive is not interposed therein. An example of the high temperature treatment process can be active annealing treatment or a thermal oxide film process. The adhesive is mainly composed of an organic-based material, and thus is resistant to only heat treatment at a temperature of about 300° C. Accordingly, a process to be used is limited. However, the semiconductor apparatus 200 according to the present embodiment can perform the high temperature treatment process to the same extent as that of the wafer because it does not use an intermediate material. That is, the frame can be bonded to the wafer 4 from an initial stage of a semiconductor device formation process, resulting in enhanced Versatility.

Figure 7:
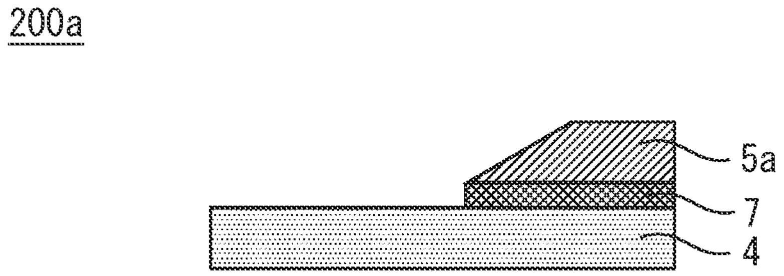
FIG. 7 is a cross-sectional view illustrating bonding in a semiconductor apparatus according to a modification of the first embodiment of the preset disclosure.

Further, when the wafer 4 and the frame 5 are directly bonded to each other, the wafer need not be ground to have a rib shape. That is, the frame 5 may be only bonded to the wafer 4 after the wafer 4, including its outer peripheral surface, is ground. This makes it possible to enhance the strength on the outer periphery of the wafer without requiring a complicated grinding process and thus to easily reduce the warping of the wafer, FIG. 7 is a cross-sectional view illustrating bonding in a semiconductor apparatus according to a modification of the first embodiment of the preset disclosure. A semiconductor apparatus **200*a* differs from the semiconductor apparatus 200 in that it includes a frame 5*a* having a tapered shape on its inner side surface. The tapered shape of the frame 5*a* is processed before being bonded to a wafer 4**.

The semiconductor apparatus 200 includes the frame 5 not having a tapered shape. Accordingly, a process for discharging a chemical solution needs to be performed after a treatment process using an etchant or a resist liquid. On the other hand, the semiconductor apparatus **200*a* includes the frame 5*a*** having a tapered shape. Accordingly, when a treatment process using an etchant or a resist liquid is performed, the chemical solution after treatment is naturally discharged along the tapered shape.

As described above, in the semiconductor apparatus **200*a*, a process for discharging the chemical solution can be omitted by using the frame 5*a*** having a tapered shape.

Second Embodiment

Figure 8:
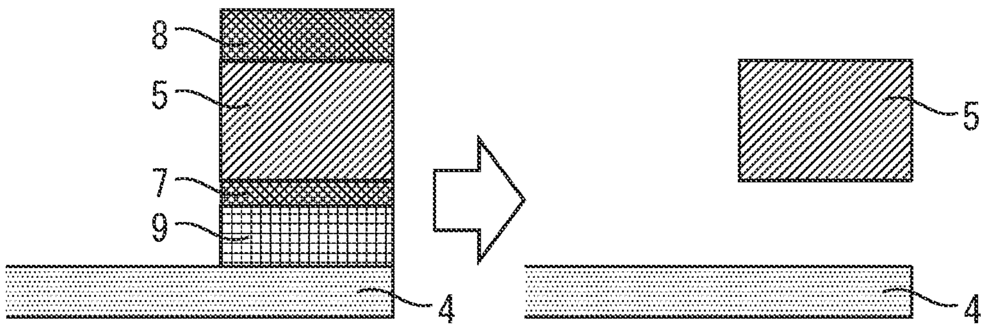
FIG. 8 is a diagram illustrating a method for manufacturing a semiconductor apparatus according to a second embodiment of the present disclosure.

FIG. 8 is a diagram illustrating a method for manufacturing a semiconductor apparatus according to a second embodiment of the present disclosure. The second embodiment differs from the first embodiment in that an intermediate layer 9 is used and in that etching is performed in a separation process for a wafer 4 and a frame 5.

The left of FIG. 8 is a cross-sectional view illustrating the semiconductor apparatus before separation. The semiconductor apparatus according to the second embodiment of the present disclosure includes the intermediate layer 9 on an interface between the wafer 4 and the frame 5.

The intermediate layer 9 is composed of an inorganic compound. As an inorganic material, SiO2, Si, Ti, or Ni, for example, can be used.

The intermediate layer 9 is film-formed by a CVD method, for example, in a bonding location to the frame 5 on the wafer 4. Then, after surface layers of the wafer 4 and the frame 5 are irradiated with atoms, the wafer 4 and the frame 5 are pressure-bonded to each other with the intermediate layer 9 interposed therebetween, thereby forming the semiconductor apparatus.

Although an aspect in which the intermediate layer 9 is film-formed in only the bonding location on the wafer 4 is illustrated here, the film formation may be performed in only one or both of the wafer 4 and the frame 5.

The right of FIG. 8 is an enlarged sectional view illustrating the semiconductor apparatus after the separation. In the separation process according to the second embodiment of the present disclosure, etching using a chemical solution with which only a metal film 8 is selectively etched with respect to the wafer 4, the frame 5, and the intermediate layer 9 is first performed. Then, etching using a chemical solution with which only the intermediate layer 9 is selectively etched with respect to the wafer 4 and the frame 5 is performed. For example, when the intermediate layer 9 is composed of SiO2, hydrofluoric acid can be used as the chemical solution.

A part of the wafer 4 does not remain in the frame 5 separated in the separation process, unlike in the first embodiment. That is, no grinding processing is required after the separation. Accordingly, the frame 5 can be made easy to reuse, Other components and processes are similar to those ii the first embodiment.

Hereinafter, various aspects of the present disclosure will be collectively described as appendixes.

(Appendix 1)

A method for manufacturing a semiconductor apparatus in which a ring-shaped frame is bonded to an outer peripheral portion of a wafer, the method comprising the steps of:

- installing one of the wafer and the frame on a stage;
- holding another of the wafer and the frame in a chuck part in a pressure-bonding mechanism;
- activating a surface layer of the outer peripheral portion of the wafer and a surface layer of the frame by atom irradiation; and
- sandwiching the wafer and the frame between the stage and the chuck pail and pressure-bonding the activated surface layers of the wafer and the frame using the pressure-bonding mechanism,
- wherein an amorphous layer is formed on a bonding interface between the wafer and the frame pressure-bonded to each other.

(Appendix 2)

The method for manufacturing the semiconductor apparatus according to appendix 1, wherein the frame has the same outer diameter as an outer diameter of the wafer, and is provided such that its end surface on an outer side is continuous with an end surface on an outer side of the wafer.

(Appendix 3)

The method for manufacturing the semiconductor apparatus according to appendix 1 or 2, wherein the frame has a tapered shape on its inner side surface.

(Appendix 4)

The method for manufacturing the semiconductor apparatus according to any one of appendixes 1 to 3, wherein the wafer and the frame are made of the same material.

(Appendix 5)

The method for manufacturing the semiconductor apparatus according to any one of appendixes 1 to 3, wherein the wafer and the frame are made of different materials.

(Appendix 6)

The method for manufacturing the semiconductor apparatus according to any one of appendixes 1 to 5, further comprising the step of cutting the wafer along an end surface on an inner side of the frame to obtain a frame bonded wafer.

(Appendix 7)

The method for manufacturing the semiconductor apparatus according to appendix 6, further comprising the step of grinding and removing a portion other than the frame from the frame bonded wafer.

(Appendix 8)

The method for manufacturing the semiconductor apparatus according to any one of appendixes 1 to 5, further comprising the steps of:

- pressure-bonding the activated surface layers of the wafer and the frame with an intermediate layer composed of an inorganic compound interposed therebetween; and
- etching the intermediate layer to remove the frame from the wafer.

(Appendix 9)

The method for manufacturing the semiconductor apparatus according to according to any one of appendixes 1 to 8, wherein the wafer is formed of a wide bandgap semiconductor.

(Appendix 10)

The method for manufacturing the semiconductor apparatus according to appendix 9, wherein the wide bandgap semiconductor is silicon carbide, a gallium nitride-based material, or diamond.

(Appendix 11)

A semiconductor manufacturing apparatus that bonds a ring-shaped frame to an outer peripheral portion of a wafer, the semiconductor manufacturing apparatus comprising:

- a stage having a first cavity having a diameter on an upper surface side smaller than an inner diameter of the frame;
- a pressure-bonding mechanism including a chuck part having a second cavity having a diameter on a lower surface side smaller than the inner diameter of the frame; and
- an atom irradiation part that activates surface layers of the wafer and the frame by atom irradiation,
- wherein the wafer and the frame are sandwiched between the stage and the chuck part, and the pressure-bonding mechanism pressure-bonds the activated surface layers of the wafer and the frame.

(Appendix 12)

A semiconductor apparatus comprising

- a wafer and a ring-shaped frame pressure-bonded to an outer peripheral portion of the wafer,
- wherein an amorphous layer is formed on a bonding interface between the wafer and the frame.

(Appendix 13)

The semiconductor apparatus according to appendix 12, wherein the frame has a thickness equal to or more than a thickness of the wafer and has a width of 1 to 5 mm.

(Appendix 14)

The semiconductor apparatus according to appendix 12 or 13, wherein the frame has the same outer diameter as an outer diameter of the wafer, and is provided such that its end surface on an outer side is continuous with an end surface on an outer side of the wafer.

(Appendix 15)

The semiconductor apparatus according to according to any one of appendixes 12 to 14, wherein the frame has a tapered shape on its inner side surface.

(Appendix 16)

The semiconductor apparatus according to any one of appendixes 12 to 15, wherein the wafer and the frame are made of the same material.

(Appendix 17)

The semiconductor apparatus according to any one of appendixes 12 to 15, wherein the wafer and the frame are made of different materials.

(Appendix 18)

The semiconductor apparatus according to any one of appendixes 12 to 17, further comprising an intermediate layer formed on a bonding interface between the wafer and the frame and composed of an inorganic compound.

(Appendix 19)

The semiconductor apparatus according to any one of appendixes 12 to 18, wherein the wafer is formed of a wide bandgap semiconductor.

(Appendix 20)

The semiconductor apparatus according to appendix 19, wherein the wide bandgap semiconductor is silicon carbide, a gallium nitride-based material, or diamond.

Obviously many modifications and variations of the present disclosure are possible in the light of the above teachings. It is therefore to be understood that within the scope of the appended claims the disclosure may be practiced otherwise than as specifically described.

The entire disclosure of a Japanese Patent Application No. 2023-039867, filed on Mar. 14, 2023 including specification, claims, drawings and summary, on which the Convention priority of the present application is based, are incorporated herein by reference in its entirety.

The invention claimed is:

1. A method for manufacturing a semiconductor apparatus in which a ring-shaped frame is bonded to an outer peripheral portion of a wafer, the method comprising the steps of:

installing one of the wafer and the frame on a stage;

holding another of the wafer and the frame in a chuck part in a pressure-bonding mechanism;

activating a surface layer of the outer peripheral portion of the wafer and a surface layer of the frame by atom irradiation; and sandwiching the wafer and the frame between the stage and the chuck part and pressure-bonding the activated surface layers of the wafer and the frame using the pressure-bonding mechanism, wherein an amorphous layer is formed on a bonding interface between the wafer and the frame pressure-bonded to each other.

2. The method for manufacturing the semiconductor apparatus according to claim 1, wherein the frame has the same outer diameter as an outer diameter of the wafer, and is provided such that its end surface on an outer side is continuous with an end surface on an outer side of the wafer.

3. The method for manufacturing the semiconductor apparatus according to claim 1, wherein the frame has a tapered shape on its inner side surface.

4. The method for manufacturing the semiconductor apparatus according to claim 1, wherein the wafer and the frame are made of the same material.

5. The method for manufacturing the semiconductor apparatus according to claim 1, wherein the wafer and the frame are made of different materials.

6. The method for manufacturing the semiconductor apparatus according to claim 1, further comprising the step of cutting the wafer along an end surface on an inner side of the frame to obtain a frame bonded wafer.

7. The method for manufacturing the semiconductor apparatus according to claim 6, further comprising the step of grinding and removing a portion other than the frame from the frame bonded wafer.

8. The method for manufacturing the semiconductor apparatus according to claim 1, further comprising the steps of:

pressure-bonding the activated surface layers of the wafer and the frame with an intermediate layer composed of an inorganic compound interposed therebetween; and etching the intermediate layer to remove the frame from the wafer.

9. The method for manufacturing the semiconductor apparatus according to claim 1, wherein the wafer is formed of a wide bandgap semiconductor.

10. The method for manufacturing the semiconductor apparatus according to claim 9, wherein the wide bandgap semiconductor is silicon carbide, a gallium nitride-based material, or diamond.

11. A semiconductor manufacturing apparatus that bonds a ring-shaped frame to an outer peripheral portion of a wafer, the semiconductor manufacturing apparatus comprising:

a stage having a first cavity having a diameter on an upper surface side smaller than an inner diameter of the frame;

a pressure-bonding mechanism including a chuck part having a second cavity having a diameter on a lower surface side smaller than the inner diameter of the frame; and an atom irradiation part that activates surface lay ers of the wafer and the frame by atom irradiation, wherein the wafer and the frame are sandwiched between the stage and the chuck part, and the pressure-bonding mechanism pressure-bonds the activated surface layers of the wafer and the frame.

* * * * *